United States Patent
Mine (10) Patent No.: US 11,235,599 B2
(45) Date of Patent: Feb. 1, 2022

(54) LIQUID DROPLET DISCHARGING APPARATUS

(71) Applicant: Tokyo Electron Limited, Tokyo (JP)

(72) Inventor: Yousuke Mine, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/912,920

(22) Filed: Jun. 26, 2020

(65) Prior Publication Data

US 2020/0406645 A1 Dec. 31, 2020

(30) Foreign Application Priority Data

Jun. 28, 2019 (JP) .............................. JP2019-122059

(51) Int. Cl.
*B41J 29/393* (2006.01)
*B41J 13/00* (2006.01)

(52) U.S. Cl.
CPC ......... *B41J 13/0009* (2013.01); *B41J 29/393* (2013.01)

(58) Field of Classification Search
CPC .............................. B41J 29/393; B41J 2/1652
See application file for complete search history.

(56) References Cited

U.S. PATENT DOCUMENTS 8,376,512 B2 * 2/2013 Ito .......................... B41J 2/1652
347/37

FOREIGN PATENT DOCUMENTS

JP 2018-008231 A 1/2018

* cited by examiner

*Primary Examiner* — Lam S Nguyen
(74) *Attorney, Agent, or Firm* — Pearne & Gordon LLP (57) ABSTRACT

A liquid droplet discharging apparatus includes a transfer device, a discharging head, a first medium supply, a second medium supply and an imaging device. The transfer device is configured to transfer a work along a transfer direction. The discharging head is configured to discharge a liquid droplet of a functional liquid to the work. The first medium supply is configured to supply a first inspection medium, which receives the liquid droplet, in a direction orthogonal to the transfer direction. The second medium supply is configured to supply a second inspection medium, which receives the liquid droplet and is arranged side by side with respect to the first inspection medium in the transfer direction, in the direction orthogonal to the transfer direction. The imaging device is configured to image the liquid droplet discharged to the first inspection medium and the liquid droplet discharged to the second inspection medium.

8 Claims, 6 Drawing Sheets

LIQUID DROPLET DISCHARGING APPARATUS

CROSS-REFERENCE TO RELATED APPLICATION

This application claims the benefit of Japanese Patent Application No. 2019-122059 filed on Jun. 28, 2019, the entire disclosure of which is incorporated herein by reference.

TECHNICAL FIELD

The various aspects and embodiments described herein pertain generally to a liquid droplet discharging apparatus.

BACKGROUND

Patent Document 1 describes a technique in which a liquid droplet of a functional liquid is discharged to an inspection film, and a discharge state of the liquid droplet is inspected by imaging the liquid droplet discharged to the inspection film by an inspection camera.

Patent Document 1: Japanese Patent Laid-open Publication No. 2018-008231

SUMMARY

In one exemplary embodiment, a liquid droplet discharging apparatus includes a transfer device, a discharging head, a first medium supply, a second medium supply and an imaging device. The transfer device is configured to transfer a work along a transfer direction. The discharging head is configured to discharge a liquid droplet of a functional liquid to the work. The first medium supply is configured to supply a first inspection medium, which receives the liquid droplet discharged from the discharging head, in a direction orthogonal to the transfer direction. The second medium supply is configured to supply a second inspection medium, which receives the liquid droplet discharged from the discharging head and is arranged side by side with respect to the first inspection medium in the transfer direction, in the direction orthogonal to the transfer direction. The imaging device is configured to image the liquid droplet discharged to the first inspection medium and the liquid droplet discharged to the second inspection medium.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of a liquid droplet discharging apparatus according to the present disclosure will be described in detail with reference to the accompanying drawings. Here, however, it should be noted that the liquid droplet discharging apparatus of the present disclosure is not limited by the following exemplary embodiment.

In the various drawings that are referred to in the following description, for the convenience of explanation, the X-axis, Y-axis and Z-axis which are orthogonal to each other will be defined, and an orthogonal coordinates system where the positive Z-axis direction is set as a vertically upward direction may be used.

The X-axis direction is a transfer direction in which a substrate W as a work is transferred. The Y-axis direction is a direction orthogonal to the transfer direction. The Z-axis direction is a direction parallel to the vertical direction.

Here, a forward-backward direction with the positive X-axis direction as the front side and the negative X-axis direction as the rear side is defined, and a left-right direction with the positive Y-axis direction as the right side and the negative Y-axis direction as the left side is defined. Further, an up-and-down direction with the positive Z-axis direction as the upper side and the negative Z-axis direction as the lower side is defined. The negative Z-axis direction is the vertical direction.

Figure 1:
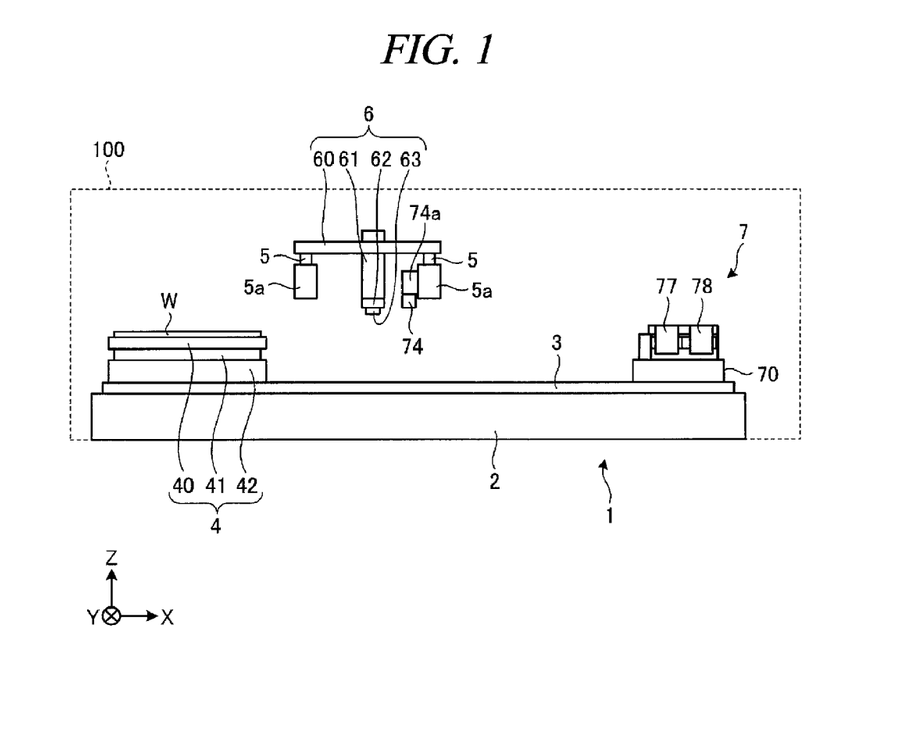
FIG. 1 is a left side view illustrating a schematic configuration of a liquid droplet discharging apparatus according to an exemplary embodiment.
Figure 2:
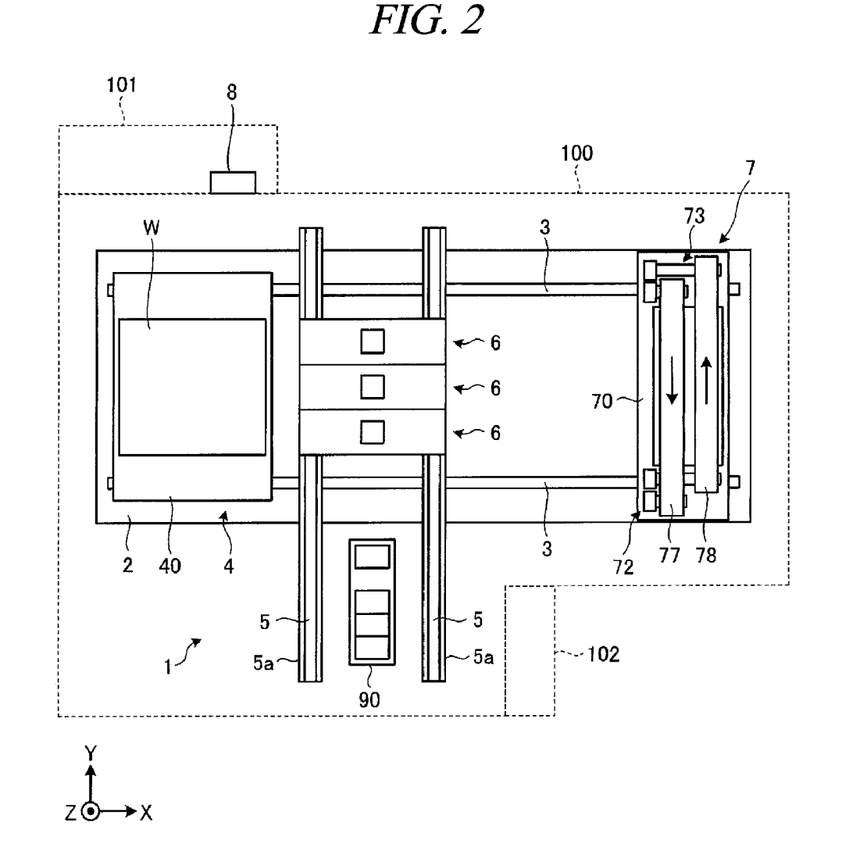
FIG. 2 is a plan view illustrating a schematic configuration of the liquid droplet discharging apparatus according to the exemplary embodiment.

A liquid droplet discharging apparatus 1 according to an exemplary embodiment will be described with reference to FIG. 1 and FIG. 2. FIG. 1 is a left side view illustrating a schematic configuration of the liquid droplet discharging apparatus 1 according to the exemplary embodiment. FIG. 2 is a plan view illustrating a schematic configuration of the liquid droplet discharging apparatus 1 according to the exemplary embodiment.

The liquid droplet discharging apparatus 1 is a drawing apparatus configured to draw on a substrate W by an ink-jet method while transferring the substrate W in the transfer direction. The substrate W is one for use in, for example, a flat panel display.

The liquid droplet discharging apparatus 1 is accommodated in a chamber room 100. An inert gas (for example, a nitrogen gas) is supplied into the chamber room 100. The liquid droplet discharging apparatus 1 discharges a functional liquid onto the substrate W in the inert gas atmosphere and performs a drawing operation on the substrate W. Alternatively, the liquid droplet discharging apparatus 1 may be an apparatus which is not accommodated in the chamber room 100.

The functional liquid includes, besides an ink, a liquid for forming a hole injection layer (HIL), a hole transport layer (HTL), or the like.

An electric chamber 101 in which a control device 8 and the like are accommodated is provided adjacent to the chamber room 100. Further, a manipulation area 102 in which a functional liquid bottle BT (see FIG. 3A) storing the function liquid therein can be replaced is provided within the chamber room 100. Except a manual manipulation by an operator, an operation regarding the manipulation area 102 to be described later is controlled by the control device 8.

Figure 3A:
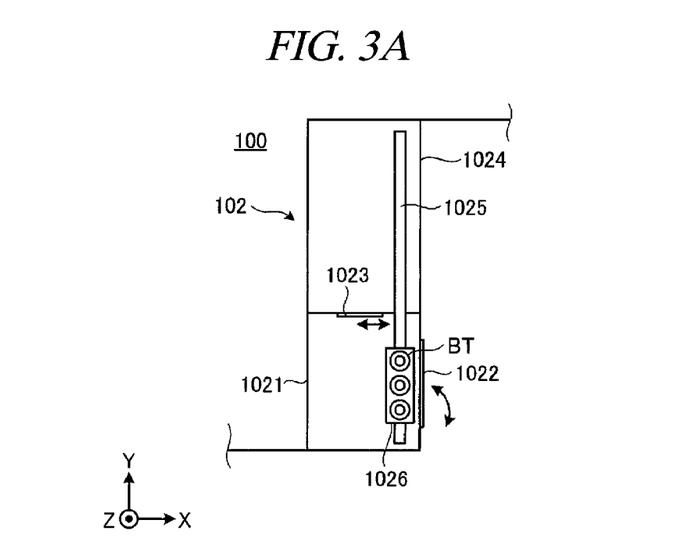
FIG. 3A is a plan view illustrating a schematic configuration of a manipulation area according to the exemplary embodiment.

The manipulation area 102 includes a replacement chamber 1021 into/from which the functional liquid bottle BT is carried in or out, as shown in FIG. 3A. FIG. 3A is a plan view illustrating a schematic configuration of the manipulation area 102 according to the exemplary embodiment.

The replacement chamber 1021 is provided with a first partition door 1022 and a second partition door 1023. The first partition door 1022 is a door configured to partition the replacement chamber 1021 and the outside. The first partition door 1022 is provided at a sidewall 1024 of the chamber room 100. The first partition door 1022 is configured to be rotated around an axis in the Z-axis direction. The second partition door 1023 is a door configured to separate the replacement chamber 1021 and an area in which the liquid droplet discharging apparatus 1 (see FIG. 2) is disposed. The second partition door 1023 is configured to be moved in, for example, the X-axis direction.

Further, a rail 1025 extending in the left-right direction is provided in the manipulation area 102. The rail 1025 is elongated into the replacement chamber 1021. The rail 1025 is provided with a bottle table 1026 configured to be moved while carrying the functional liquid bottle BT thereon.

Figure 3B:
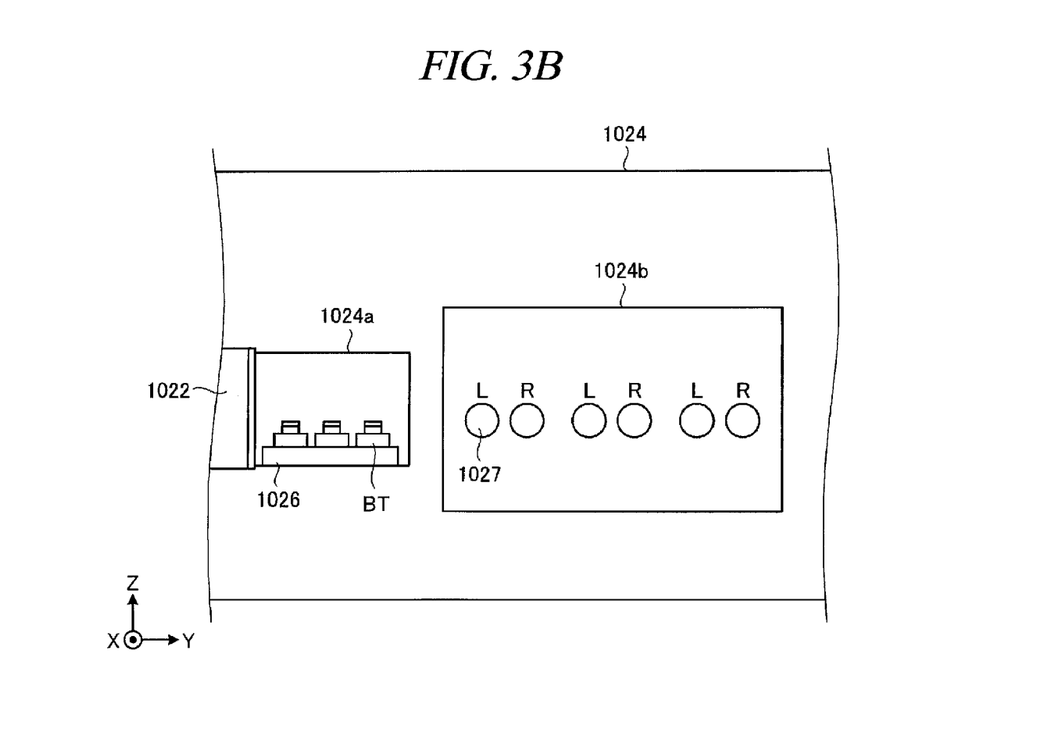
FIG. 3B is a side view illustrating a schematic configuration of a sidewall according to the exemplary embodiment.

An opening 1024a and a replacement window 1024b are provided at the sidewall 1024, as depicted in FIG. 3B. FIG. 3B is a side view illustrating a schematic configuration of the sidewall 1024 according to the exemplary embodiment. The opening 1024a is opened or closed as the first partition door 1022 is opened or closed. Provided at the replacement window 1024b are multiple manipulation gloves 1027 for receiving hands of the operator inserted therein to replace the functional liquid bottle BT.

When replacing the functional liquid bottle BT, a drawing device 6 (see FIG. 2) is transferred into the manipulation area 102. For example, the drawing device 6 is transferred into the manipulation area 102 when a maintenance mode is selected and a bottle replacement button is operated. Further, if a remaining amount within the functional liquid bottle BT falls below a preset amount, the drawing device 6 may be automatically transferred into the manipulation area 102.

By way of example, the first partition door 1022 and the second partition door 1023 can be opened after the drawing device 6 is transferred into the manipulation area 102. A non-illustrated gas intake/exhaust device is connected to the replacement chamber 1021. By enabling the first partition door 1022 to be open or closed after the inside of the replacement chamber 1021 is replaced by CDA (Clean Dry Air) or an external atmosphere at an outside of the apparatus through the gas intake/exhaust device, it is possible to suppress the inert gas within the replacement chamber 1021 to be exhausted to the outside at one time. The first partition door 1022 is opened, and a new functional liquid bottle BT is placed on the bottle table 1026 by the operator. Further, the second partition door 1023 is kept closed. If the first partition door 1022 is closed by the operator, the inside of the replacement chamber 1021 is replaced by the inert gas by using the gas intake/exhaust device. Further, a non-illustrated oxygen concentration meter may be provided within the replacement chamber 1021. An end point of the replacement from the inert gas into the CDA or the external atmosphere of the apparatus and an end point of the replacement from the CDA or the external atmosphere of the apparatus into the inert gas may be decided based on whether an oxygen concentration measured by the oxygen concentration meter has reached a preset value.

Figure 3C:
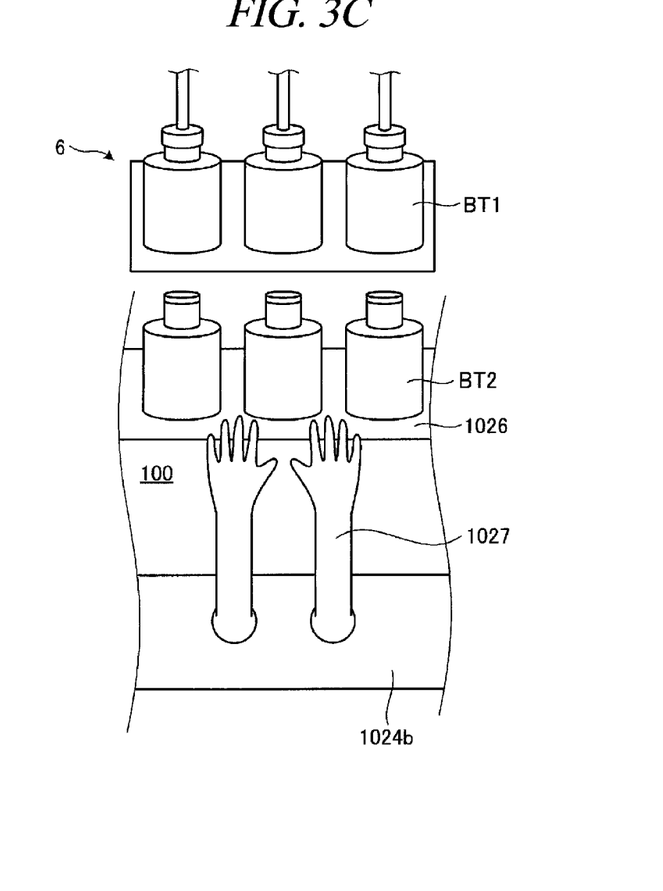
FIG. 3C is a diagram illustrating an example of a replacement work for a functional liquid bottle according to the exemplary embodiment.

After the inside of the replacement chamber 1021 is replaced by the inert gas, the second partition door 1023 is opened, and the bottle table 1026 is transferred from the replacement chamber 1021 into the area in which the liquid droplet discharging apparatus 1 is disposed. If the bottle table 1026 is sent into the area in which the liquid droplet discharging apparatus 1 is placed, the operator inserts his/her hands into the manipulation gloves 1027, as shown in FIG. 3C, and replaces a functional liquid bottle BT1 after being used by the drawing device 6 with a new functional liquid bottle BT2 placed on the bottle table 1026. FIG. 3C is a diagram illustrating an example of a replacement work for the functional liquid bottle BT.

Upon the completion of the replacement of the functional liquid bottle BT, the bottle table 1026 on which the used functional liquid bottle BT1 is placed is transferred into the replacement chamber 1021, and the second partition door 1023 is closed. Thereafter, the inside of the replacement chamber 1021 is replaced by the external atmosphere of the apparatus or the CDA. Then, the first partition door 1022 is opened, and the operator is capable of take out the used functional liquid bottle BT.

Referring back to FIG. 1 and FIG. 2, the liquid droplet discharging apparatus 1 is equipped with a mounting table 2, first guide rails 3, a substrate transfer device 4 (an example of a transfer device), second guide rails 5, the drawing device 6, an inspection device 7, and the control device 8.

The mounting table 2 is elongated in the transfer direction of the substrate W. That is, the mounting table 2 is elongated in the forward-backward direction.

The first guide rails 3 are placed on a top surface of the mounting table 2. The first guide rails 3 are provided in a pair to be arranged side by side in the left-right direction. Each of the first guide rails 3 is elongated in the forward-backward direction.

The substrate transfer device 4 is equipped with a work stage 40, a stage rotator 41, and a slider 42. The substrate transfer device 4 is configured to transfer the substrate W (work) in the transfer direction (forward-backward direction).

The work stage 40 is, for example, a vacuum-attracting stage and configured to attract the substrate W. The stage rotator 41 is disposed under the work stage 40 and configured to rotate the work stage 40 around an axis parallel to the up-and-down direction. That is, the work stage 40 is supported by the stage rotator 41 such that it is rotatable around the axis parallel to the up-and-down direction.

Further, a work alignment camera (not shown) configured to image an alignment mark of the substrate W on the work stage 40 is disposed above the work stage 40. The stage rotator 41 is rotated around the axis parallel to the up-and-down direction based on an image obtained by the work alignment camera, and corrects a position of the substrate W.

The slider 42 is provided under the stage rotator 41 and supports the stage rotator 41 and the work stage 40. The slider 42 is fastened to the pair of first guide rails 3 and configured to be moved along the pair of first guide rails 3 by a driving unit (not shown), for example, a linear motor provided at at least one of the pair of first guide rails 3.

That is, the work stage 40 and the stage rotator 41 are moved in the forward-backward direction along with the slider 42 as the slider 42 is moved in the forward-backward direction along the pair of first guide rails 3. Accordingly, the substrate W is transferred in the forward-backward direction.

Further, the substrate transfer device 4 may be a floating-type transfer device. The floating-type transfer device supports a periphery of the substrate W from below and moves the substrate W while maintaining the substrate W horizontally by jetting compressed air toward the substrate W from below.

The second guide rails 5 are provided in a pair to be arranged side by side in the forward-backward direction. Each of the second guide rails 5 extends in the left-right direction. Each of the second guide rails 5 is fixed on a top surface of a supporting member 5a which is formed to have, for example, a door shape.

The pair of second guide rails 5 extend more to the left than, for example, the mounting table 2. A maintenance unit 90 is provided between the pair of second guide rails 5 which extend more to the left than the mounting table 2. The second guide rails 5 are configured to allow the drawing device 6 to be movable in the left-right direction between a drawing position where the drawing device 6 performs the drawing operation on the substrate W and a maintenance position where the maintenance is performed by the maintenance unit 90.

The maintenance unit 90 is configured to perform maintenance of a nozzle head 63 to be described later, and resolves or suppresses a discharge defect of the nozzle head 63 or the like.

The drawing device 6 is plural in number, and the drawing devices 6 are arranged in the left-right direction. By way of example, three drawing devices 6 are arranged in the left-right direction. Further, the number of the drawing devices 6 is not limited thereto. Each drawing device 6 is equipped with a carriage plate 60, a carriage rotator 61, a carriage 62, and the nozzle head 63 (an example of a discharging head).

The carriage plate 60 is fastened to the pair of second guide rails 5, and configured to be moved in the left-right direction along the pair of second guide rails 5 by a driving unit (not shown), for example, a linear motor provided at at least one of the pair of second guide rails 5. Further, a plurality of carriage plates 60 may be configured to be movable in the left-right direction as a single body.

The carriage rotator 61 is disposed under the carriage plate 60. The carriage rotator 61 is fastened to a center of the carriage plate 60 in the forward-backward direction. The carriage 62 is mounted to a lower end of the carriage rotator 61. The carriage rotator 61 is configured to support the carriage 62 such that the carriage 62 is rotatable around an axis parallel to the up-and-down direction.

Further, the carriage rotator 61 is also configured to rotate the carriage around the axis parallel to the up-and-down direction based on an image obtained by a carriage alignment camera (not shown) provided at the work stage 40. Accordingly, a position of the carriage 62 is corrected.

The carriage 62 is provided with a plurality of nozzle heads 63. By way of example, the nozzle heads 63 are arranged in two rows in the left-right direction. Further, the nozzle heads 63 are arranged in six rows in the forward-backward direction. The nozzle heads 63 adjacent in the forward-backward direction are deviated from each other in their positions in the left-right direction. Further, the nozzle heads 63 may be arranged in one row or more than two rows in the left-right direction.

The functional liquid is supplied to each nozzle head 63 from the functional liquid bottle (not shown), and the nozzle head 63 discharges the liquid droplet of the functional liquid onto the substrate W (work). The nozzle heads 63 are capable of discharging multiple kinds of functional liquids.

Figure 4:
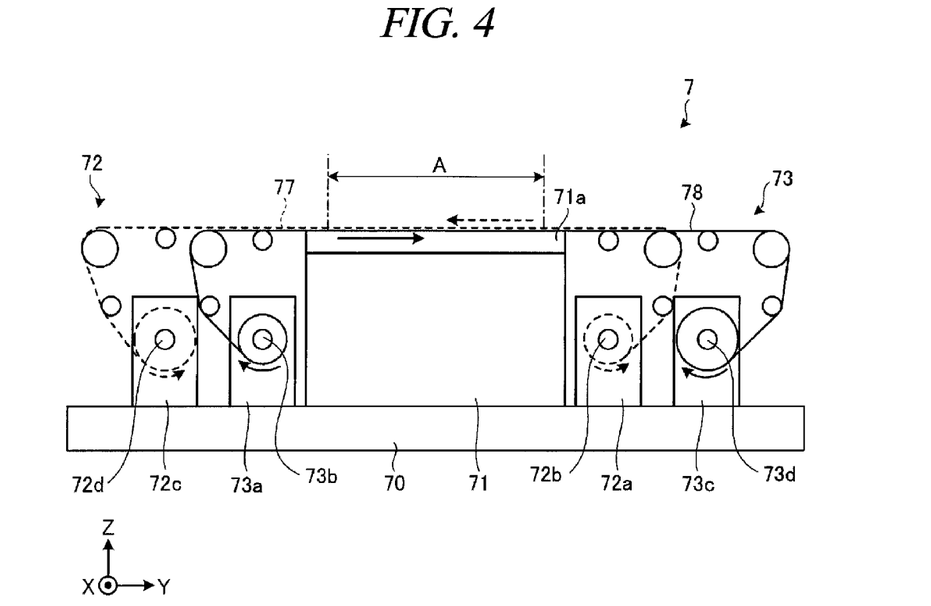
FIG. 4 is a diagram illustrating a schematic configuration of a part of an inspection device according to the exemplary embodiment, seen from a positive X-axis direction.

Now, the inspection device 7 will be discussed with reference to FIG. 4. FIG. 4 is a diagram illustrating a schematic configuration of a part of the inspection device 7 according to the exemplary embodiment, seen from the positive X-axis direction. Further, in FIG. 4, a first inspection film 77 is indicated by a dashed line.

The inspection device 7 is configured to receive the liquid droplet of the functional liquid by the first inspection film 77 (an example of a first inspection medium) and a second inspection film 78 (an example of a second inspection medium) which is arranged side by side with respect to the first inspection film 77 in the forward-backward direction, and configured to image a discharge state of the liquid droplet.

One of the first inspection film 77 and the second inspection film 78 is an inspection film having permeability, and the other is an inspection film having water repellency. To be specific, a front surface (a surface onto which the liquid droplet is discharged) of the one of the inspection films 77 and 78 has the permeability. A front surface (a surface onto which the liquid droplet is discharged) of the other of the inspection films 77 and 78 has the water repellency.

The inspection device 7 is equipped with a slider 70, an inspection table 71, a first film supply 72 (an example of a first medium supply), a second film supply 73 (an example of a second medium supply), and an imaging device 74 (see FIG. 1).

The slider 70 is fastened to the pair of first guide rails 3 and extends in the left-right direction. The slider 70 is configured to be movable along the pair of first guide rails 3 by a driving unit (not shown), for example, a linear motor provided at at least one of the pair of first guide rails 3. That is, the slider 70 is configured to be moved in the forward-backward direction.

The slider 70 is moved between a discharge position, an imaging position and a standby position which are set along the forward-backward direction.

The discharge position is a position under the nozzle head 63. The discharge position includes a first discharge position where the liquid droplet of the functional liquid for inspection discharged by the nozzle head 63 is received by the first inspection film 77 and a second discharge position where the liquid droplet of the functional liquid for inspection discharged by the nozzle head 63 is received by the second inspection film 78.

The imaging position is a position located at the front side than the discharge position and is located under the imaging device 74. The imaging position includes a first imaging position where the first inspection film 77 is imaged and a second imaging position where the second inspection film 78 is imaged. The standby position is a position located at the front side than the imaging position.

The inspection table 71 is fastened to a center of a top surface of the slider 70 in the left-right direction. The inspection table 71 is configured to be moved in the forward-backward direction along with the slider 70.

A length of the inspection table 71 in the left-right direction is longer than a length of a discharge area A (see FIG. 4) in which the liquid droplets of the functional liquid are discharged to the respective inspection films 77 and 78 by the drawing device 6.

An attraction plate 71a is provided on a top surface of the inspection table 71. The attraction plate 71a is made of, by way of example, a porous member. Further, a suction device (not shown) is accommodated in the inspection table 71. Through suctioning by the suction device, the first inspection film 77 and the second inspection film 78 are attracted to the attraction plate 71a.

Further, two sets of the inspection table 71 and the attraction plate 71a may be provided in the forward-backward direction. Specifically, the inspection table 71 and the attraction plate 71a for attracting the first inspection film 77 and the inspection table 71 and the attraction plate 71a for attracting the second inspection film 78 may be provided.

The first film supply 72 is disposed above the slider 70. The first film supply 72 is configured to supply the first inspection film 77 (first inspection medium), which receives the liquid droplet for inspection discharged from the nozzle head 63, in the left-right direction (the direction orthogonal to the transfer direction).

The first film supply 72 includes a first unwinding shaft support 72a, a first unwinding shaft 72b, a first winding shaft support 72c, and a first winding shaft 72d.

The first unwinding shaft support 72a is fixed on the top surface of the slider 70. The first unwinding shaft support 72a is disposed at the right of the inspection table 71. The first unwinding shaft support 72a is configured to support the first unwinding shaft 72b rotatably.

The first unwinding shaft 72b is protruded from the first unwinding shaft support 72a toward the front side. The first unwinding shaft 72b is disposed at the right of the inspection table 71. The first inspection film 77 having a roll shape is fastened to the first unwinding shaft 72b. The first unwinding shaft 72b unwinds the first inspection film 77.

The first winding shaft support 72c is fixed to the top surface of the slider 70. The first winding shaft support 72c is disposed at the left of the inspection table 71. The first winding shaft support 72c is configured to support the first winding shaft 72d rotatably. The first winding shaft support 72c is provided with a motor (not shown) configured to rotate the first winding shaft 72d. Also, the first unwinding shaft support 72a may be provided with a motor configured to rotate the first unwinding shaft 72b.

The first winding shaft 72d is protruded from the first winding shaft support 72c toward the front side. The first winding shaft 72d is disposed at the left of the inspection table 71. One end of the first inspection film 77 is fastened to the first winding shaft 72d, and the first winding shaft 72d winds the first inspection film 77 on which the liquid droplet of the functional liquid is discharged. To elaborate, the first winding shaft 72d is rotated as the motor provided at the first winding shaft support 72c is rotated, and winds the first inspection film 77 on which the liquid droplet of the functional liquid is discharged.

The first unwinding shaft 72b and the first winding shaft 72d are disposed with the inspection table 71 therebetween in the left-right direction. The first film supply 72 is configured to supply the first inspection film 77 from the right side toward the left side. In the following description, the supply direction of the first inspection film 77 may be referred to as "first direction."

That is, the first film supply 72 supplies the first inspection film 77 along the first direction which is orthogonal to the transfer direction of the substrate W.

The second film supply 73 is disposed above the slider 70. The second film supply 73 is configured to supply, in the left-right direction, the second inspection film 78 which receives the liquid droplet of the functional liquid for inspection discharged from the nozzle head 63, and is arranged side by side with respect to the first inspection film 77 in the forward-backward direction. The second inspection film 78 is disposed at the front side than the first inspection film 77.

The second film supply 73 includes a second unwinding shaft support 73a, a second unwinding shaft 73b, a second winding shaft support 73c, and a second winding shaft 73d.

The second unwinding shaft support 73a is fixed on the top surface of the slider 70. The second unwinding shaft support 73a is disposed at the left of the inspection table 71. The second unwinding shaft support 73a is configured to support the second unwinding shaft 73b rotatably.

The second unwinding shaft 73b is protruded from the second unwinding shaft support 73a toward the front side. The second unwinding shaft 73b is disposed at the left of the inspection table 71. The second inspection film 78 having a roll shape is fastened to the second unwinding shaft 73b. The second unwinding shaft 73b unwinds the second inspection film 78.

The second winding shaft support 73c is fixed to the top surface of the slider 70. The second winding shaft support 73c is disposed at the right of the inspection table 71. The second winding shaft support 73c is configured to support the second winding shaft 73d rotatably. The second winding shaft support 73c is provided with a motor (not shown) configured to rotate the second winding shaft 73d. Also, the second unwinding shaft support 73a may be provided with a motor configured to rotate the second unwinding shaft 73b.

The second winding shaft 73d is protruded from the second winding shaft support 73c toward the front side. The second winding shaft 73d is disposed at the right of the inspection table 71. One end of the second inspection film 78 is fastened to the second winding shaft 73d, and the second winding shaft 73d winds the second inspection film 78 on which the liquid droplet of the functional liquid is discharged. To elaborate, the second winding shaft 73d is rotated as the motor provided at the second winding shaft support 73c is rotated, and winds the second inspection film 78 on which the liquid droplet of the functional liquid is discharged.

The second unwinding shaft 73b and the second winding shaft 73d are disposed with the inspection table 71 therebetween in the left-right direction. The second film supply 73 is configured to supply the second inspection film 78 from the left side toward the right side. In the following description, the supply direction of the second inspection film 78 may be referred to as "second direction."

That is, the second film supply 73 supplies the second inspection film 78 along the second direction which is opposite to the first direction.

In the first film supply 72 and the second film supply 73, the unwinding shafts 72b and 73b and the winding shafts 72d and 73d are disposed at different positions in the left-right direction which is orthogonal to the transfer direction.

Further, in the first film supply 72 and the second film supply 73, the first winding shaft 72d of the first film supply 72 and the second unwinding shaft 73b of the second film supply 73 are disposed at the left of the inspection table 71. The second unwinding shaft 73b is positioned closer to the inspection table 71 than the first winding shaft 72d is, that is, near the discharge area A in which the liquid droplet of the functional liquid is discharged by the nozzle head 63 (see FIG. 1).

Further, the first unwinding shaft 72b of the first film supply 72 and the second winding shaft 73d of the second film supply 73 are disposed at the right of the inspection table 71. The first unwinding shaft 72b is positioned closer to the inspection table 71 than the second winding shaft 73d is, that is, near the discharge area A in which the liquid droplet of the functional liquid is discharged by the nozzle head 63 (see FIG. 1).

Since the unwinding shafts 72b and 73b and the winding shafts 72d and 73d are arranged as stated above, a distance by which the first inspection film 77 unwound from the first unwinding shaft 72b is supplied to the discharge area A can be shortened. Further, a distance by which the second inspection film 78 unwound from the second unwinding shaft 73b is supplied to the discharge area A can be shortened.

Moreover, the first film supply 72 and the second film supply 73 are capable of supplying the first inspection film 77 and the second inspection film 78 independently.

In the above-described exemplary embodiment, the first winding shaft 72d and the second unwinding shaft 73b are disposed at the left of the inspection table 71, whereas the first unwinding shaft 72b and the second winding shaft 73d are disposed at the right of the inspection table 71. However, the exemplary embodiment is not limited thereto. The first winding shaft 72d and the second unwinding shaft 73b may be provided at the right of the inspection table 71, and the first unwinding shaft 72b and the second winding shaft 73d may be arranged at the left of the inspection table 71. That is, the first direction and the second direction may be reverse to the above-stated directions, respectively.

The imaging device 74 is fastened to the second guide rail 5 with a base 74a therebetween, as illustrated in FIG. 1. The base 74a is equipped with a moving device (not shown) configured to move the imaging device 74 in the left-right direction. The imaging device 74 is mounted to, between the pair of second guide rails 5, one second guide rail 5 disposed at the front side. That is, the imaging device 74 is disposed at the front side than the carriage 62.

The imaging device 74 is configured to image the liquid droplet of the functional liquid discharged on the first inspection film 77 and the liquid droplet of the functional liquid discharged on the second inspection film 78.

Further, the imaging device 74 may be plural in number, and the liquid droplets of the functional liquid discharged to the first inspection film 77 and the second inspection film 78 may be imaged by the imaging devices 74. In this case, the imaging devices 74 may not be configured to be movable in the left-right direction but may be fixed to the second guide rails 5.

The control device 8 shown in FIG. 2 is, for example, a computer, and includes a controller (not shown) and a storage (not shown). The storage is implemented by a semiconductor memory device such as, but not limited to, a RAM (Random Access Memory) or a flash memory, or a storage device such as, but not limited to, a hard disk or an optical disk.

The controller includes a microcomputer having a CPU (Central Processing Unit), a ROM (Read Only Memory), a RAM, an input/output port, and so forth and various kinds of circuits. The CPU of the microcomputer implements controls over the substrate transfer device 4, the drawing device 6, the inspection device 7, and so forth by reading out a program stored in the ROM and executing the program.

Further, the program may be recorded on a computer-readable recording medium and installed from the recording medium to the storage of the control device 8. The computer-readable recording medium may be, by way of non-limiting example, a hard disk HD, a flexible disk FD, a compact disk CD, a magnetic optical disk MO, a memory card, or the like.

In the liquid droplet discharging apparatus 1, the discharge state of the nozzle head 63 is adjusted based on an imaging result of the liquid droplet of the functional liquid obtained by the imaging device 74. Depending on the kind of the functional liquid, the liquid droplet discharging apparatus 1 is capable of switching the inspection film for receiving the liquid droplet of the functional liquid between the first inspection film 77 and the second inspection film 78.

Now, a liquid droplet inspection in the inspection device 7 will be explained. Here, an example where the liquid droplet of the functional liquid is discharged to the first inspection film 77 will be described.

The slider 70 of the inspection device 7 is maintained at the standby position as shown in FIG. 1 when the liquid droplet inspection is not performed, for example, when the functional liquid is being discharged onto the substrate W by the drawing device 6 or when the liquid droplet discharging apparatus 1 is not operated.

Figure 5:
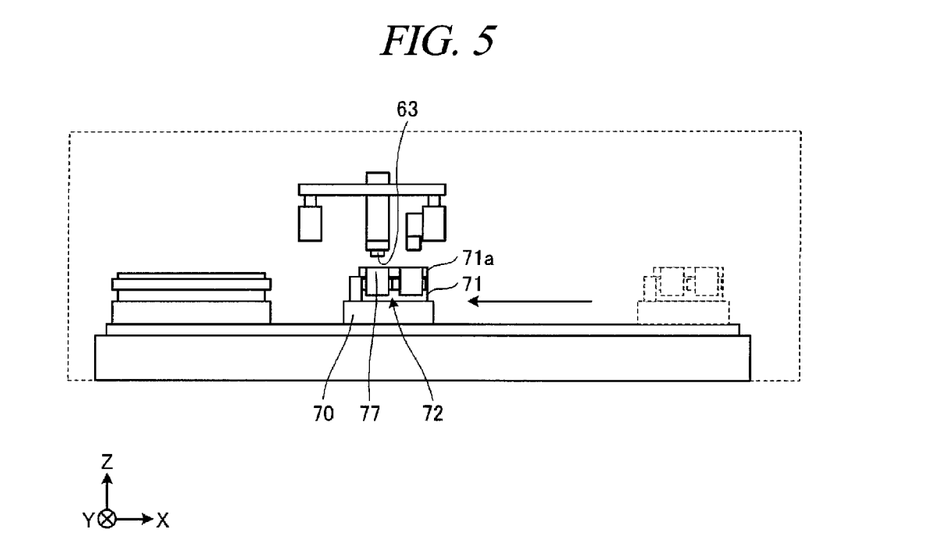
FIG. 5 is a schematic diagram illustrating a state in which a slider according to the exemplary embodiment is moved from a standby position to a first discharge position.

To receive the liquid droplet of the functional liquid discharged from the nozzle head 63 by the first inspection film 77, the slider 70 is moved backwards from the standby position. To elaborate, the slider 70 is moved from the standby position to the first discharge position where the first inspection film 77 is located under the nozzle head 63, as shown in FIG. 5. FIG. 5 is a schematic diagram illustrating a state in which the slider 70 according to the exemplary embodiment is moved from the standby position to the first discharge position.

While the slider 70 is being moved from the standby position to the first discharge position or after the slider 70 is moved to the first discharge position, the first film supply 72 performs winding of the first inspection film 77 on which the liquid droplet of the functional liquid is discharged in a previous liquid droplet inspection. Accordingly, the first inspection film 77 on which the liquid droplet of the functional liquid is discharged is wound by the first winding shaft 72d, so that a new first inspection film 77 is placed on the attraction plate 71a of the inspection table 71.

After the slider 70 is moved to the first discharge position, the nozzle head 63 discharges the liquid droplet of the functional liquid onto the first inspection film 77. The liquid droplet of the functional liquid is discharged onto the first inspection film 77 in the state that the first inspection film 77 is attracted to the top surface of the attraction plate 71a.

Figure 6:
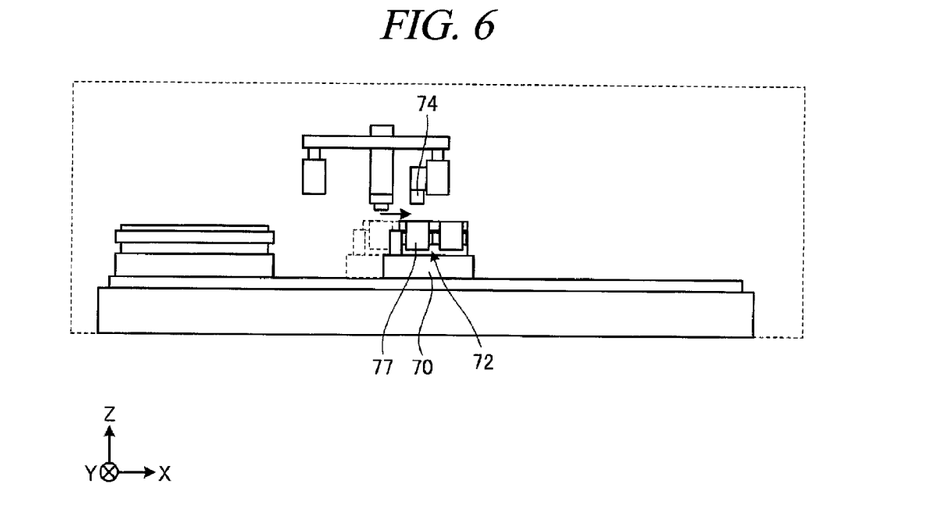
FIG. 6 is a schematic diagram illustrating a state in which the slider according to the exemplary embodiment is moved from the first discharge position to a first imaging position.

After the liquid droplet of the functional liquid is discharged onto the first inspection film 77 from the nozzle head 63, the slider 70 is moved from the first discharge position to the first imaging position where the first inspection film 77 is located under the imaging device 74, as shown in FIG. 6. FIG. 6 is a schematic diagram illustrating a state in which the slider 70 according to the exemplary embodiment is moved from the first discharge position to the first imaging position.

After the slider 70 is moved to the first imaging position, the liquid droplet of the functional liquid discharged onto the first inspection film 77 is imaged by the imaging device 74.

Figure 7:
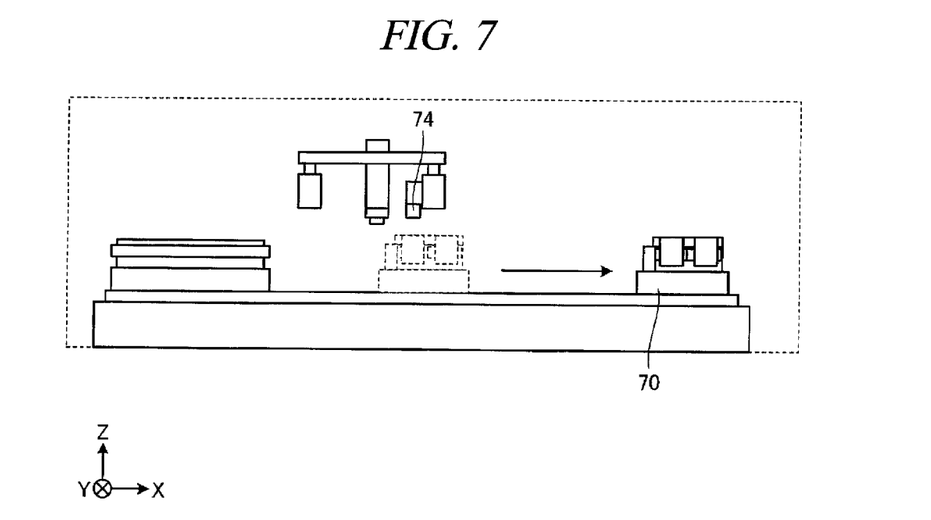
FIG. 7 is a schematic diagram illustrating a state in which the slider according to the exemplary embodiment is moved from the first imaging position to the standby position.

If the imaging of the liquid droplet of the functional liquid discharged to the first inspection film 77 is completed, the slider 70 is moved from the first imaging position to the standby position, as depicted in FIG. 7. FIG. 7 is a schematic diagram illustrating a state in which the slider 70 according to the exemplary embodiment is moved from the first imaging position to the standby position.

When the liquid droplet of the functional liquid is discharged onto the second inspection film 78, the slider 70 is moved from the standby position to the second discharge position where the second inspection film 78 is located under the nozzle head 63. Further, after the liquid droplet of the functional liquid is discharged onto the second inspection film 78, the slider 70 is moved from the second discharge position to the second imaging position where the second inspection film 78 is located under the imaging device 74. The other processes are the same as those performed when the liquid droplet of the functional liquid is discharged to the first inspection film 77.

Now, effects of the exemplary embodiment will be described.

The liquid droplet discharging apparatus 1 includes the transfer device 4 configured to transfer the substrate W in the forward-backward direction (transfer direction); and the nozzle head 63 configured to discharge the liquid droplet of the functional liquid onto the substrate W. Further, the liquid droplet discharging apparatus 1 is equipped with the first film supply 72 configured to supply the first inspection film 77, which receives the liquid droplet of the functional liquid for inspection discharged from the nozzle head 63, in the left-right direction (the direction orthogonal to the transfer direction). Further, the liquid droplet discharging apparatus 1 is further equipped with the second film supply 73 configured to supply, in the left-right direction, the second inspection film 78 which is configured to receive the liquid droplet of the functional liquid for inspection discharged from the nozzle head 63 and is arranged side by side with respect to the first inspection film 77 in the transfer direction. Furthermore, the liquid droplet discharging apparatus 1 is further equipped with the imaging device 74 configured to image the liquid droplet discharged onto the first inspection film 77 and the liquid droplet discharged onto the second inspection film 78.

With this configuration, the liquid droplet discharging apparatus 1 is capable of imaging the liquid droplet of the functional liquid discharged from the nozzle head 63 by using the first inspection film 77 and the second inspection film 78, and is capable of adjusting the discharge state of the functional liquid in the nozzle head 63 based on the imaging result. Therefore, the liquid droplet discharging apparatus 1 is capable of adjusting the discharge state of the liquid droplet of the functional liquid efficiently.

Further, the first film supply 72 is equipped with the first unwinding shaft 72b configured to unwind the first inspection film 77 and the first winding shaft 72d configured to wind the first inspection film 77. Furthermore, the second film supply 73 is equipped with the second unwinding shaft 73b configured to unwind the second inspection film 78 and the second winding shaft 73d configured to wind the second inspection film 78. The unwinding shafts 72b and 73b are disposed at the different positions in the left-right direction, and the winding shafts 72d and 73d are disposed at the different positions in the left-right direction.

With this configuration, the liquid droplet discharging apparatus 1 is capable of supplying the first inspection film 77 and the second inspection film 78 independently, and the configurations of the first film supply 72 and the second film supply 73 can be simplified. Furthermore, when replacing the first inspection film 77 or the second inspection film 78, the liquid droplet discharging apparatus 1 is capable of replacing the inspection film as the replacement target while allowing the inspection film which is not the replacement target to be left. Therefore, the replacement can be carried out easily.

The first film supply 72 supplies the first inspection film 77 along the first direction which is the left-right direction, and the second film supply 73 supplies the second inspection film 78 along the second direction which is opposite to the first direction. As compared to the second winding shaft 73d, the first unwinding shaft 72b is placed closer to the discharge area A in which the liquid droplet is discharged by the nozzle head 63. The second unwinding shaft 73b is disposed closer to the discharge area A than the first winding shaft 72d is.

Accordingly, the liquid droplet discharging apparatus 1 is capable of shortening the distance by which the first inspection film 77 is supplied to the discharge area A from the first unwinding shaft 72b. Further, the liquid droplet discharging apparatus 1 is capable of shortening the distance by which the second inspection film 78 is supplied to the discharge area A from the second unwinding shaft 73b. Thus, the liquid droplet discharging apparatus 1 is capable of shortening a time during which the first inspection film 77 supplied to the discharge area A from the first unwinding shaft 72b and the second inspection film 78 supplied to the discharge area A from the second unwinding shaft 73b is exposed to the atmosphere within the chamber room 100.

That is, the liquid droplet discharging apparatus 1 is capable of shortening a time taken until the first inspection film 77 is imaged by the imaging device 74 after the unwinding of the first inspection film 77 from the first unwinding shaft 72b is begun. Further, the liquid droplet discharging apparatus 1 is capable of shortening a time taken until the second inspection film 78 is imaged by the imaging device 74 after the unwinding of the second inspection film 78 from the second unwinding shaft 73b is begun. Therefore, the liquid droplet discharging apparatus 1 is capable of imaging the state of the liquid droplet of the functional liquid accurately, and capable of adjusting the discharge state of the liquid droplet of the functional liquid with high precision.

Further, one of the first inspection film 77 and the second inspection film 78 is the inspection film having the permeability, and the other is the inspection film having the water repellency.

Accordingly, the liquid droplet discharging apparatus 1 is capable of receiving the liquid droplet of the functional liquid by using the different kinds of inspection films 77 and 78. Therefore, the liquid droplet discharging apparatus 1 is capable of switching the inspection film for receiving the liquid droplet of the functional liquid between the first inspection film 77 and the second inspection film 78 depending on the kinds of the functional liquids having different properties. Further, the liquid droplet discharging apparatus 1 is capable of imaging the discharge state of the liquid droplet of the functional liquid accurately based on the property of the functional liquid, and thus capable of adjusting the discharge state of the liquid droplet of the functional liquid with high precision. Besides, since the discharge state of the liquid droplets of the functional liquids having the different properties can be adjusted by the single liquid droplet discharging apparatus 1, the system including the liquid droplet discharging apparatus 1 can be scaled down.

Now, a modification example of the present exemplary embodiment will be discussed.

In the liquid droplet discharging apparatus 1 according to the modification example, the supply direction of the first inspection film 77 in the first film supply 72 and the supply direction of the second inspection film 78 in the second film supply 73 may be set to be identical. By way of example, the second film supply 73 may supply the second inspection film 78 along the first direction.

In the liquid droplet discharging apparatus 1 according to the modification example, the first unwinding shaft 72b and the second unwinding shaft 73b are disposed at the left of the inspection table 71, whereas the first winding shaft 72d and the second winding shaft 73d are provided at the right of the inspection table 71, for example.

With this configuration, the liquid droplet discharging apparatus 1 according to the modification example is capable of suppressing the functional liquid scattered from the first inspection film 77 wound by the first winding shaft 72d from adhering to the roll-shaped second inspection film 78 fastened to the second unwinding shaft 73b. Furthermore, the liquid droplet discharging apparatus 1 according to the modification example is also capable of suppressing the functional liquid scattered from the second inspection film 78 wound by the second winding shaft 73d from adhering to the roll-shaped first inspection film 77 fastened to the first unwinding shaft 72b.

In addition, in the liquid droplet discharging apparatus 1 according to the modification example, the nozzle head 63 may discharge the liquid droplets of the same functional liquid to the first inspection film 77 and the second inspection film 78. The liquid droplet discharging apparatus 1 according to the modification example may discharge the liquid droplets of the same functional liquid to the first inspection film 77 having the permeability and the second inspection film 78 having the water repellency.

Besides, in the liquid droplet discharging apparatus 1 according to the modification example, the first inspection film 77 and the second inspection film 78 to which the liquid droplets of the same functional liquid are discharged are imaged by the imaging device 74.

Accordingly, the liquid droplet discharging apparatus 1 according to the modification example is capable of adjusting the discharge state of the liquid droplets based on the imaging results of the liquid droplets of the functional liquid discharged to the different kinds of inspection films 77 and 78, and thus capable of adjusting the discharge state of the liquid droplets of the functional liquid with high precision.

Moreover, in the liquid droplet discharging apparatus 1 according to the modification example, the first inspection film 77 and the second inspection film 78 may be a same inspection film (an example of a same medium).

Accordingly, the liquid droplet discharging apparatus 1 according to the modification example is capable of reducing the frequency of the replacement of the inspection films 77 and 78, and thus capable of improving working efficiency.

According to the exemplary embodiment, it is possible to adjust the discharge state of the liquid droplet efficiently.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A liquid droplet discharging apparatus, comprising:
a transfer device configured to transfer a work along a transfer direction;
a discharging head configured to discharge a liquid droplet of a functional liquid to the work;
a first medium supply configured to supply a first inspection medium, which receives the liquid droplet discharged from the discharging head, in a direction orthogonal to the transfer direction;
a second medium supply configured to supply a second inspection medium, which receives the liquid droplet discharged from the discharging head and is arranged side by side with respect to the first inspection medium in the transfer direction, in the direction orthogonal to the transfer direction; and
an imaging device configured to image the liquid droplet discharged to the first inspection medium and the liquid droplet discharged to the second inspection medium,
wherein the first medium supply comprises:
a first unwinding shaft configured to unwind the first inspection medium; and
a first winding shaft configured to wind the first inspection medium,
wherein the second medium supply comprises:
a second unwinding shaft configured to unwind the second inspection medium; and
a second winding shaft configured to wind the second inspection medium, and
wherein the unwinding shafts are disposed at different positions in the direction orthogonal to the transfer direction, and the winding shafts are disposed at different positions in the direction orthogonal to the transfer direction.

2. The liquid droplet discharging apparatus of claim 1,
wherein the first medium supply supplies the first inspection medium along a first direction which is the direction orthogonal to the transfer direction,
the second medium supply supplies the second inspection medium along a second direction opposite to the first direction,
the first unwinding shaft is disposed closer to a discharge area, in which the liquid droplet is discharged from the discharging head, than the second winding shaft is, and
the second unwinding shaft is disposed closer to the discharge area than the first winding shaft is.

3. The liquid droplet discharging apparatus of claim 1,
wherein the first medium supply supplies the first inspection medium along a first direction which is the direction orthogonal to the transfer direction, and
the second medium supply supplies the second inspection medium along the first direction.

4. The liquid droplet discharging apparatus of claim 1,
wherein the first inspection medium and the second inspection medium are same.

5. The liquid droplet discharging apparatus of claim 1,
wherein the discharging head discharges a same functional liquid to the first inspection medium and the second inspection medium.

6. A liquid droplet discharging apparatus, comprising:
a transfer device configured to transfer a work along a transfer direction;
a discharging head configured to discharge a liquid droplet of a functional liquid to the work;
a first medium supply configured to supply a first inspection medium, which receives the liquid droplet discharged from the discharging head, in a direction orthogonal to the transfer direction;
a second medium supply configured to supply a second inspection medium, which receives the liquid droplet discharged from the discharging head and is arranged side by side with respect to the first inspection medium in the transfer direction, in the direction orthogonal to the transfer direction; and
an imaging device configured to image the liquid droplet discharged to the first inspection medium and the liquid droplet discharged to the second inspection medium,
wherein a first one of the first inspection medium and the second inspection medium is a medium having permeability, and
a second one of the first inspection medium and the second inspection medium is a medium having water repellency.

7. The liquid droplet discharging apparatus of claim 6,
wherein the discharging head discharges a same functional liquid to the first inspection medium and the second inspection medium.

8. The liquid droplet discharging apparatus of claim 6,
wherein the first inspection medium and the second inspection medium are same.

* * * * *